(12) United States Patent
Chrysostomides et al.

(10) Patent No.: US 6,240,005 B1
(45) Date of Patent: May 29, 2001

(54) SENSE AMPLIFIER CONFIGURATION WITH FUSED DIFFUSION REGIONS AND A DISTRIBUTED DRIVER SYSTEM

(75) Inventors: Athanasia Chrysostomides, München; Robert Feurle, Neubiberg; Doominique Savignac, Ismaning; Helmut Schneider, München, all of (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/511,820

(22) Filed: Feb. 24, 2000

(30) Foreign Application Priority Data

Feb. 24, 1999 (DE) .............................................. 199 07 922

(51) Int. Cl.$^7$ ........................................................ G11C 5/02
(52) U.S. Cl. ................................ 365/51; 365/63; 365/205
(58) Field of Search .................................. 365/51, 63, 205

(56) References Cited

U.S. PATENT DOCUMENTS

| 4,660,174 | 4/1987 | Takemae et al. |
| 5,875,452 | * 2/1999 | Katayama et al. ............... 365/233 X |

FOREIGN PATENT DOCUMENTS

| 4132864C2 | 12/1995 | (DE) . |
| 2184311A | 6/1987 | (GB) . |

\* cited by examiner

*Primary Examiner*—Huan Hoang
(74) *Attorney, Agent, or Firm*—Herbert L. Lerner; Laurence A. Greenberg; Werner H. Stemer

(57) ABSTRACT

The sense-amp transistors of the sense amplifier configuration are arranged in a common continuous diffusion region. The drivers are disposed directly adjacent and parallel to the diffusion region. A short local connection between the sense-amp transistors and the drivers is thereby ensured.

8 Claims, 2 Drawing Sheets

SENSE AMPLIFIER CONFIGURATION WITH FUSED DIFFUSION REGIONS AND A DISTRIBUTED DRIVER SYSTEM

BACKGROUND OF THE INVENTION

FIELD OF THE INVENTION

The invention lies in the semiconductor technology field. More specifically, the present invention relates to a sense amplifier configuration for a semiconductor memory device having a multiplicity of sense amplifier (sense-amp) transistors and drivers assigned thereto. Such sense amplifiers are also frequently referred to as read-write amplifiers.

The term "drivers" as used in this text is intended to mean a single transistor or else a multiplicity of individual transistors which are each provided for driving the sense-amp transistors.

In existing semiconductor memory devices, the sense-amp transistors are arranged alternately with drivers at the edge of a cell array. In other words, a group of sense-amp transistors is followed by a driver, which is in turn followed by a group of sense-amp transistors. Such an arrangement is shown in FIG. 3, which illustrates groups 1 of sense-amp transistors alternating with drivers 2. The cell array or cell field is situated on the right-hand side of FIG. 3 in the illustrated arrangement.

Such a configuration of sense-amp transistors 1 and drivers 2 opens up certain advantages for the layout of semiconductor memory devices, which is why there has been no departure from such an implementation heretofore. These advantages include, by way of example, a saving of area on account of the alternate implementation of sense amplifier groups and drivers.

It is disadvantageous, however, in the existing sense amplifier configuration shown in FIG. 3, that the individual sense-amp transistor groups 1 each have different diffusion regions and, moreover, the wiring paths between individual sense-amp transistors of the respective groups 1 and the associated driver 2 may be relatively long.

SUMMARY OF THE INVENTION

It is accordingly an object of the invention to provide a sense amplifier configuration, which overcomes the above-mentioned disadvantages of the heretofore-known devices and methods of this general type, in which critical diffusion region distances between individual sense-amp transistor groups are avoided, and in which the drivers can be optimally coupled to the sense-amp transistors.

With the foregoing and other objects in view there is provided, in accordance with the invention, a sense amplifier configuration for a semiconductor memory device, comprising:

a multiplicity of sense-amp transistors of a given conductivity type each disposed in a common continuous diffusion region; and a driver for the sense-amp transistors disposed directly adjacent the sense-amp transistors and parallel to the diffusion region.

In other words, the objects of the invention are satisfied with the sense amplifier configuration in which the sense-amp transistors of each conductivity type each have a common continuous diffusion region and the drivers for the sense-amp transistors are arranged parallel to the diffusion region directly next to the transistors.

Therefore, the sense amplifier configuration according to the invention departs from the concept of the previous layout for sense amplifiers and drivers: instead of the alternate arrangements of sense-amp transistor groups and drivers, in this case a respective continuous diffusion region in the form of a strip is provided in the first instance for the sense-amp transistors of each conductivity type, that is to say for P-type sense-amp transistors and N-type sense-amp transistors, with the result that critical diffusion region distances for fabrication are avoided in principle. The drivers each lie directly next to the N-type sense-amp transistors and the P-type sense-amp transistors, with the result that the drivers and the sense-amp transistors can be optimally coupled and, in particular, no large wiring resistances delay the charge transfer.

What is essential to the present invention, therefore, is that all the P-type sense-amp transistors and all the N-type sense-amp transistors in each case have a common diffusion region located at the side of a memory cell array. A respective driver comprising one or a multiplicity of transistors, as was explained in the introduction, is provided parallel to these diffusion regions for the P-type sense-amp transistors and the N-type sense-amp transistors.

In accordance with an added feature of the invention, the sense-amp transistors are U-shaped with limbs, and the sense-amp transistors are arranged linearly in rows, with the limbs in each row extending in one direction and the driver arranged parallel to the row along the open limbs.

The U-shaped configuration of the sense-amp transistors means that the width of the latter is practically doubled. Instead of the previously straight gates of the sense-amp transistors of existing semiconductor memory devices, therefore, the sense amplifier configuration according to the invention employs sense-amp transistors whose gates are no longer straight but U-shaped, which, in an advantageous manner, essentially doubles the channel width.

As has already been pointed out, these U-shaped sense-amp transistors are each provided in direct proximity to the drivers, with the result that short local connections can be constructed between the drivers and the sense-amp transistors without large wiring resistances. Delays in the power transfer between the drivers and the sense-amp transistors are thereby avoided.

In accordance with an additional feature of the invention, therefore, a short local connection is provided between each sense amplifier transistor and the driver.

In accordance with a concomitant feature of the invention, a drain of the sense-amp transistor is disposed between the limbs, and a source of the sense-amp transistor is disposed outside the limbs.

In other words, it is also advantageous, in the case of the U-shaped sense-amp transistors, for the drain to be situated between the limbs of the "U" and for the source to be situated outside the limbs of the "U".

Other features which are considered as characteristic for the invention are set forth in the appended claims.

Although the invention is illustrated and described herein as embodied in a sense amplifier configuration with fused diffusion regions and a distributed driver system, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 3:
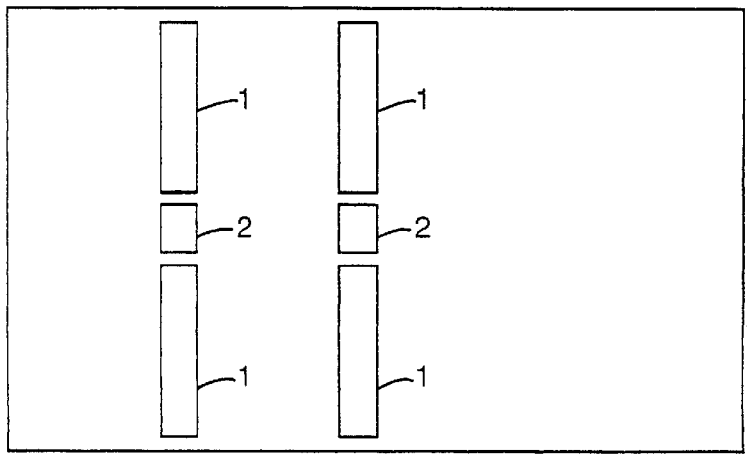
FIG. 3 is a diagrammatic plan view of a prior art sense amplifier configuration.

The prior art FIG. 3 has been explained in the introduction to the specification.

Figure 1:
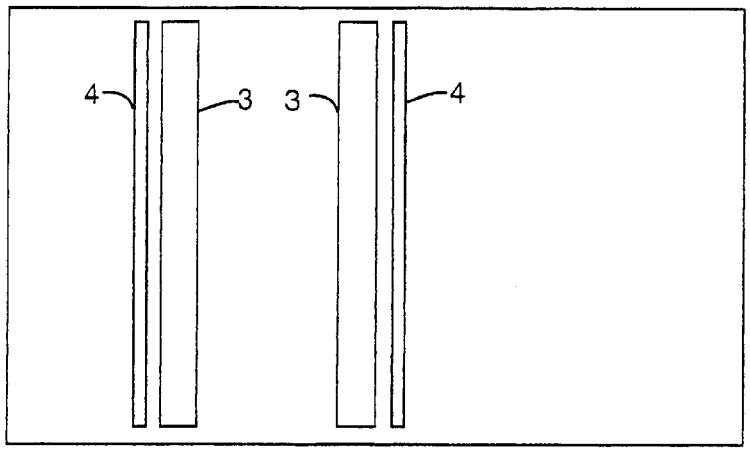
FIG. 1 is a diagrammatic plan view of a sense amplifier configuration according to the invention.

Referring now to the figures of the drawing in detail and first, particularly, to FIG. 1 thereof, there is seen a diagrammatic plan view of the sense amplifier configuration according to the invention. In that configuration strips 3 of sense-amp transistors are provided next to a memory cell array (on the right-hand side, for example, in FIG. 1). A driver 4 is provided directly next to each strip 3, so that there are short wirings between the individual sense-amp transistors of the strip 3 and the driver 4.

Figure 2:
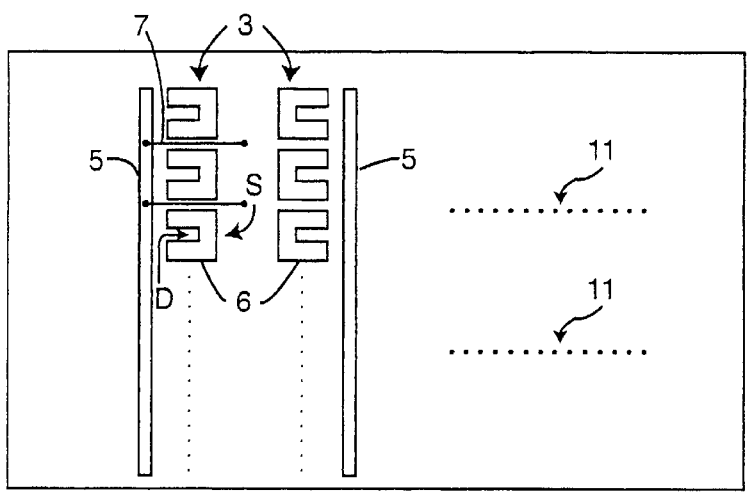
FIG. 2 is a plan view of the sense amplifier configuration of FIG. 1 with the configuration of the individual sense-amp transistors.

FIG. 2 shows more detail of the strips 3: each strip 3 comprises a row of U-shaped MOS sense-amp transistors 6, where the "U" illustrated represents the shape of the gate electrode. The drain D is situated between the limbs of the "U", while the source S is arranged on the outer side of the "U". This configuration of the sense-amp transistors 6 results in a large channel width, which is advantageous for the sense-amp transistors and the functioning thereof.

These sense-amp transistors 6 all lie in a common diffusion region shared by the two strips 3. This diffusion region may be N-conducting or P-conducting, depending on whether the sense-amp transistors 6 are N-channel MOS transistors or P-channel MOS transistors. By way of example, a P-conducting diffusion region can be used for N-channel MOS transistors, while an N-conducting channel region is used for P-channel MOS transistors.

If N-type sense-amp transistors and P-type sense-amp transistors are provided in a semiconductor memory arrangement, then the arrangement of FIG. 2 is repeated, this being indicated by dots 11. In other words, if FIG. 2 shows N-type sense-amp transistors 6, for example, then the same arrangement with rows 3 and drivers 5 is repeated for P-type sense-amp transistors, as is indicated by the dots 11.

The drivers 5 lie near the sense-amp transistors 6, so that the desired electrodes (source nodes) of the sense-amp transistors 6 can be connected to the drivers 5 by wirings 7 by means of short local connections. Since the wiring resistances are thus low, a delay in the power transfer is avoided.

Figure 4:
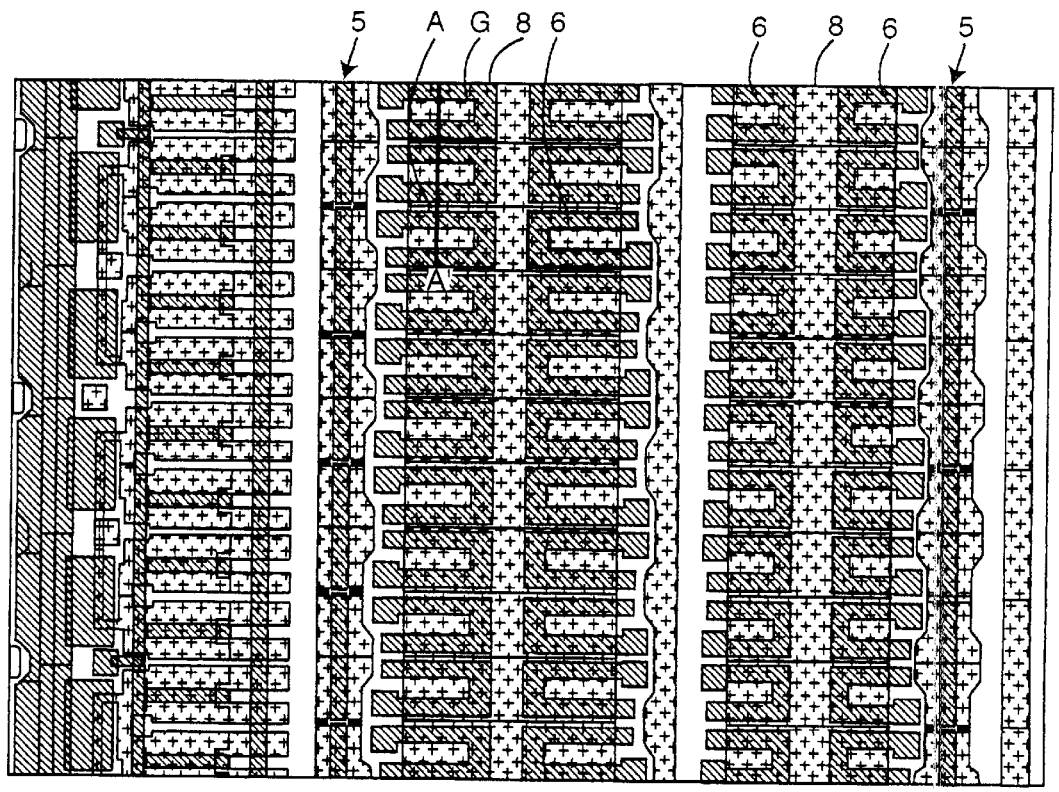
FIG. 4 is a plan view of a diffusion plane of the sense amplifier configuration according to the invention.

FIG. 4 shows a plan view of a plane above the diffusion regions with twice two strips of sense-amp transistors 6 (for illustration purposes, one of these sense-amp transistors 6 with its contacts has been emphasized in the representation). The drivers 5 are visible next to these strips 3, only one driver 5 being assigned to the two strips 3 in this case. If appropriate, however, it is also possible to provide a second driver 5, as is shown diagrammatically in FIG. 2.

The strips 3 shown on the left in FIG. 4 form N-type sense-amp transistors while the strips 3 illustrated on the right in FIG. 4 contain P-type sense-amp transistors. As can be seen from FIG. 4, the drivers 5 comprising one or more transistors are in direct proximity to the sense-amp transistors 6, so that a low wiring resistance and a practically delay-free power transfer can be ensured by the wirings 7.

Figure 5:
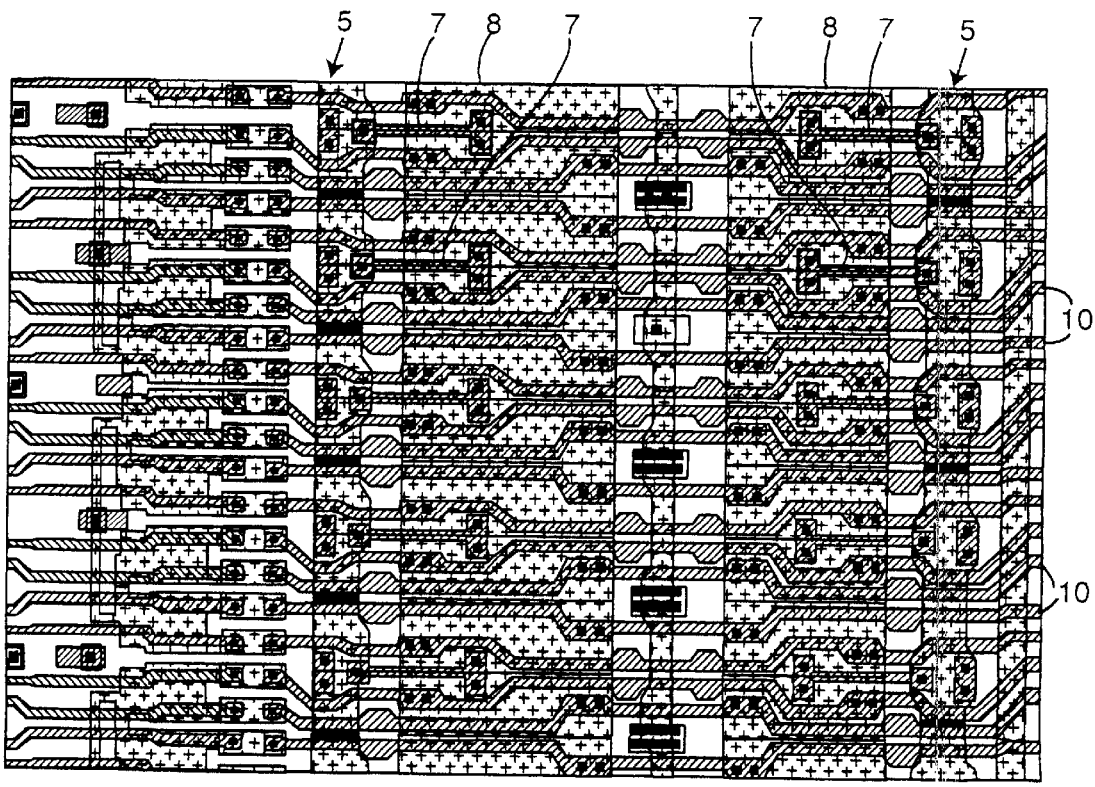
FIG. 5 is a plan view of a higher wiring plane in the sense amplifier configuration of FIG. 4.

The sense-amp transistors 6 are situated in a diffusion region 8 which, in the exemplary embodiment of FIGS. 4 and 5, is shared by in each case two strips 3 of the sense-amp transistors 6.

Figure 6:
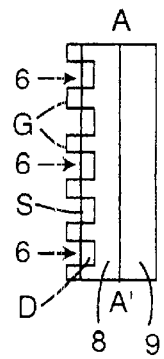
FIG. 6 is a section taken along the line A–A' in FIG. 4.

FIG. 6 shows a section AA' through three sense-amp transistors 6 in a diffusion region 8 on a semiconductor substrate 9. The gate electrodes G are U-shaped, the source S is arranged outside the "U", while the drain D lies within the "U".

FIG. 5 is a further plan view in a metallization plane lying above the plane of FIG. 4. FIG. 5 shows, particularly, the wirings 7 which serve to connect the sense-amp transistors 6 and the drivers 5. Moreover, bit lines 10 are also shown, said bit lines running in a higher plane across the sense-amp transistors 3 and the drivers 5.

What is advantageous about the sense amplifier configuration according to the invention is, in particular, the optimum coupling of the sense-amp transistors 3 to the drivers 5 without large wiring resistances, and the completely fused configuration of the diffusion regions 8 of the sense-amp transistors 3.

We claim:

1. A sense amplifier configuration for a semiconductor memory device, comprising:

a multiplicity of sense-amp transistors of a given conductivity type each disposed in a common continuous diffusion region; and a driver for said sense-amp transistors disposed directly adjacent said sense-amp transistors and parallel to the diffusion region.

2. The sense amplifier configuration according to claim 1, including a respective short local connection between each sense amplifier transistor and said driver.

3. The sense amplifier configuration according to claim 1, wherein said sense-amp transistors are U-shaped with limbs, and said sense-amp transistors are disposed linearly in rows, with said limbs in each row extending in one direction and said driver disposed parallel to the row along said open limbs.

4. The sense amplifier configuration according to claim 3, wherein a drain of said sense-amp transistor is disposed between said limbs and a source of said sense-amp transistor is disposed outside said limbs.

5. A sense amplifier configuration for a semiconductor memory device, comprising:

a multiplicity of sense-amp transistors of a given conductivity type each disposed in a common continuous diffusion region, said sense-amp transistors being U-shaped with limbs; and a driver for said sense-amp transistors disposed directly adjacent said sense-amp transistors and parallel to the diffusion region.

6. The sense amplifier configuration according to claim 5, including a respective short local connection between each sense amplifier transistor and said driver.

7. The sense amplifier configuration according to claim 5, wherein said sense-amp transistors are disposed linearly in rows, with said limbs in each row extending in one direction and said driver disposed parallel to the row along said open limbs.

8. The sense amplifier configuration according to claim 7, wherein a drain of said sense-amp transistor is disposed between said limbs and a source of said sense-amp transistor is disposed outside said limbs.

* * * * *